(12) United States Patent
Ra

(10) Patent No.: US 6,269,022 B1
(45) Date of Patent: Jul. 31, 2001

(54) THRESHOLD VOLTAGE SETTING CIRCUIT FOR REFERENCE MEMORY CELL AND METHOD FOR SETTING THRESHOLD VOLTAGE USING THE SAME

(75) Inventor: Kyeong Man Ra, Chungcheongbuk-do (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 09/472,847

(22) Filed: Dec. 28, 1999

(30) Foreign Application Priority Data

Jun. 29, 1999 (KR) ................................................ 99-25469

(51) Int. Cl.[7] .................................................... G11C 16/04
(52) U.S. Cl. ................................ 365/185.24; 365/185.19; 365/185.2
(58) Field of Search ........................... 365/185.2, 185.19, 365/185.22, 185.24, 185.33

(56) References Cited

U.S. PATENT DOCUMENTS

| | | | |
|---|---|---|---|
| 5,608,669 | 3/1997 | Mi et al. ........................ | 365/185.19 |
| 5,966,330 | * 10/1999 | Tang et al. ..................... | 365/185.2 |
| 6,128,228 | * 10/2000 | Pasotti et al. .................. | 365/182.21 |
| 6,169,691 | * 10/1999 | Pasotti et al. .................. | 365/185.25 |

* cited by examiner

Primary Examiner—Vu A. Le
Assistant Examiner—Hien Nguyen
(74) Attorney, Agent, or Firm—Fleshner & Kim, LLP

(57) ABSTRACT

Threshold voltage setting circuit for a reference memory cell for immediate and accurate setting of a threshold voltage without time consumption; and a method for setting a threshold voltage using the same, the circuit including a reference memory cell having a source, a drain, a floating gate and a control gate, a first power source for applying a voltage to the drain of the reference memory cell under the control of the current detector when the reference memory cell is programmed, a second power source for supplying a voltage to the control gate of the reference memory cell when the reference memory cell is programmed or read, a third current connected to the source of the reference memory cell, a switch connected to the drain of the reference memory cell for controlling a path for external measuring of a current flowing to the reference memory cell in response to a measuring signal, and a current detector connected between the first power source and the drain of the reference memory cell for providing a stop signal to the first and second power sources to stop the programming of the reference memory cell forcibly when a current to the reference memory cell, which is monitored during the programming of the reference memory cell in response to a program signal, is the same with a reference stop current.

8 Claims, 3 Drawing Sheets

THRESHOLD VOLTAGE SETTING CIRCUIT FOR REFERENCE MEMORY CELL AND METHOD FOR SETTING THRESHOLD VOLTAGE USING THE SAME

BACKGROUND OF THE INVENTION

1. Field of the Invention

The present invention relates to a semiconductor memory, and more particularly, to a threshold voltage setting circuit for a reference memory cell for immediate and accurate setting of a threshold voltage without time consumption; and a method for setting a threshold voltage using the same.

2. Background of the Related Art

FIG. 1 illustrates a circuitry system of a related art threshold voltage setting circuit for a reference memory cell.

Referring to FIG. 1, the related art threshold voltage setting circuit for a reference memory cell is provided with a plurality of memories 2 each having a gate terminal connected to a wordline 3, and a drain terminal connected to a bitline. There is an inverter connected to an initial input terminal of each wordline 3. There is a selection transistor 5 connected between a cascode device 6 and a drain terminal of respective memories 2 for connection of a column load device 7 to a pertinent memory 2 through the cascode device 6. There is an inverter between a gate terminal and a source terminal of the cascode device 6 for inverting a signal from a source terminal and providing to the gate terminal. There is a plurality of reference memory cell 9 each having a source, a drain, a control gate and a floating gate and connected to a reference column load device 12 through respective selection device 10 and cascode device 11. There is an inverter between the gate terminal and the source terminal of the cascode device 11 for inverting a signal from the source terminal and providing to the gate terminal. And, there is a sense amplifier 8 having an SIN terminal with a voltage level of a contact node CN1 of the column load device 7 and the cascode device 6 applied thereto and a RIN terminal with a voltage level of a contact node CN2 of the column load device 12 and the cascode device 11 applied thereto. There is a switch SW between the contact node CN1 and the SIN for controlling a path for transmitting a signal from the contact node CN1 to the SIN terminal, and there is an NMOS transistor 16 for providing a signal to a pad 15 under the control of the controller 14 when the switch SW is closed. The sense amplifier 8 compares the signal to the SIN terminal to the signal to the RIN terminal. The floating gates of respective reference memory cells 9 are programmed to levels different from one another. In order to program the reference memory cells 9 to different levels, there is a voltage switch 13 for applying charge pulses to the reference memory cells 9 until respective memory cells 9 store target charge amounts. And, there is a controller 14 for controlling the voltage switch 13 the selection device 10, the NMOS transistor and the switch SW. The foregoing related art circuit for setting a threshold voltage for a reference memory cell set the target threshold voltage accurately using a characteristic curve of a load connected to the bitline in the reference memory cell, and provides many program pulse combinations in programming the reference memory cell for minimizing a time period required for programming up to the target threshold voltages. Initially, a program pulse width is made large to permit a threshold voltage shift greater, and the program pulse width is made the smaller gradually as the threshold voltage approaches to a target value the more as the programing is repeated, for securing accuracy to the maximum and minimizing a time period required for reaching to the target threshold voltage. The controller 14 makes the program pulse combinations and sets up a reference for program verification. After programming the reference memory cell, a program verification is made, for verifying reach of the threshold voltage to the target value. And, if not reached to the target, the programming/program verification is repeated until the threshold voltage of the reference memory cell is reached to the target threshold voltage. In other words, in order to initialize more than one reference memory cells having different threshold voltages, accurate verifying reference voltages are applied externally through the controller 14, and a plurality of program pulse combinations are used for reducing an overall program time period.

However, the related art circuit for setting a threshold voltage for a reference memory cell has the following problems.

First, the verification of an injected charge amount required whenever the program pulses are provided to the reference memory cells causes a time period required for reaching to the target threshold voltage longer.

Second, the controller required for using a method, in which, a program pulse width is made large initially and the program pulse width is made the smaller as the threshold voltage approaches to a target value causes the operation complicated.

Third, a resolution for making a final pulse width to approach to a desired target threshold voltage accurately is poor.

SUMMARY OF THE INVENTION

Accordingly, the present invention is directed to a threshold voltage setting circuit for a reference memory cell for immediate and accurate setting of a threshold voltage without time consumption, and a method for setting a threshold voltage using the same that substantially obviates one or more of the problems due to limitations and disadvantages of the related art.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the threshold voltage setting circuit for a reference memory cell includes a reference memory cell having a source, a drain, a floating gate and a control gate, a first power source for applying a voltage to the drain of the reference memory cell under the control of the current detector when the reference memory cell is programmed, a second power source for supplying a voltage to the control gate of the reference memory cell when the reference memory cell is programmed or read, a third current connected to the source of the reference memory cell, a switch connected to the drain of the reference memory cell for controlling a path for external measuring of a current flowing to the reference memory cell in response to a measuring signal, and a current detector connected between the first power source and the drain of the reference memory cell for providing a stop signal to the first and second power sources to stop the programming of the reference memory cell forcibly when a current to the reference memory cell, which is monitored during the programming of the reference memory cell in response to a program signal, is the same with a reference stop current.

In other aspect of the present invention, there is provided the method for setting a threshold voltage by using a circuit for setting a threshold voltage for a reference memory cell, including the steps of (1) applying a voltage to the control gate for programming a selected unit reference memory cell in a reference memory cell unit, (2) closing a switch for measuring an initial current to the unit reference memory cell, (3) setting a first program stop reference current equal to, or slightly smaller than the initial current, (4) programming the selected unit reference memory cell by using the first program stop reference current according to an auto-verifying method, (5) fixing the voltage applied to the control gate of the selected unit reference memory cell and changing over to a read mode for measuring a current to the selected unit reference memory cell after the selected unit reference memory cell is programmed, (6) setting a target current by using a transconductance in a read mode at a target threshold voltage, (7) calculating a final program stop reference current by using a first program stop reference current, a target current, and a current measured in a read mode, (8) programming the selected unit reference memory cell by auto verifying method to set a target threshold voltage by using the final program stop reference current.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENT

Reference will now be made in detail to the preferred embodiments of the present invention, examples of which are illustrated in the accompanying drawings.

Figure 1:
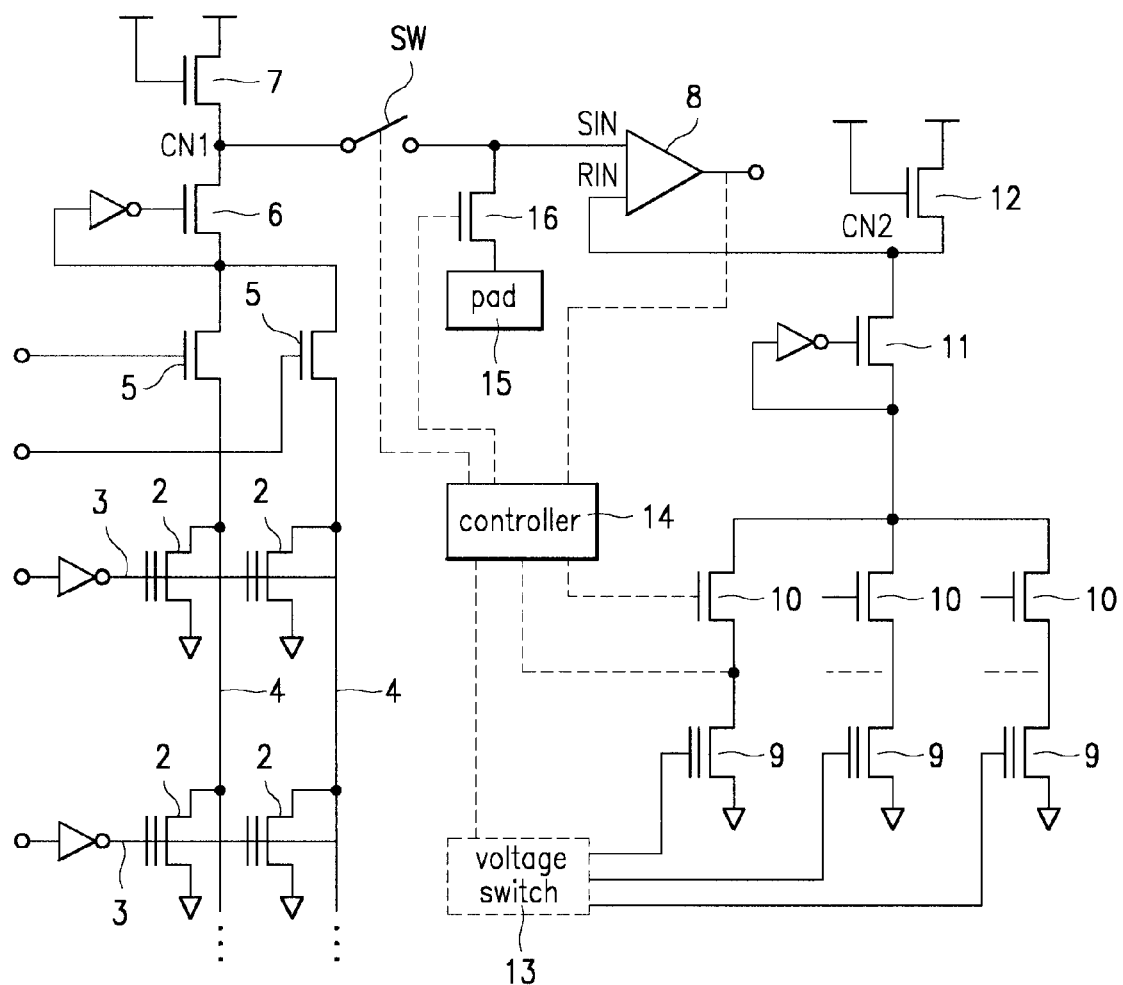
FIG. 1 illustrates a circuitry system of a related art threshold voltage setting circuit for a reference memory cell.
Figure 2:
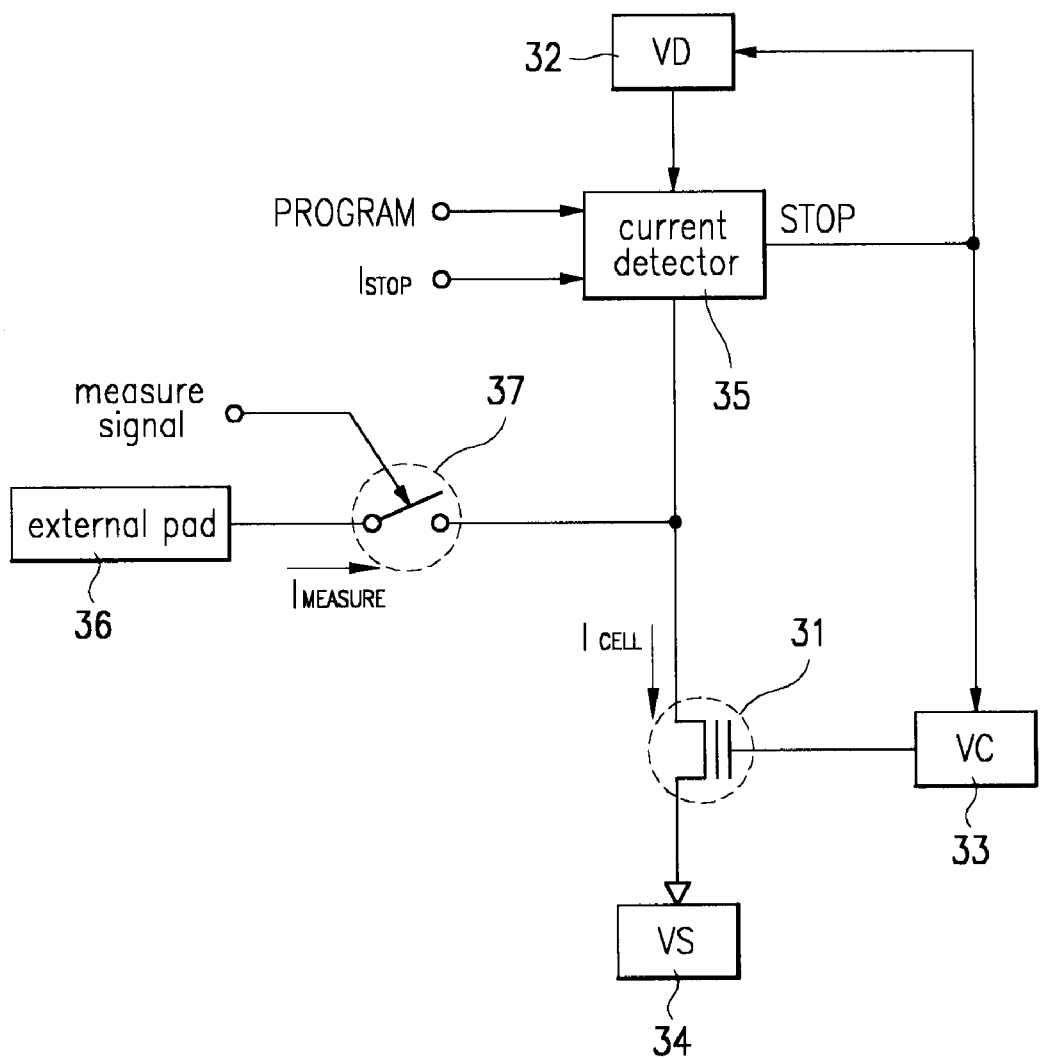
FIG. 2 illustrates a circuitry system of a threshold voltage setting circuit for a reference memory cell in accordance with a preferred embodiment of the present invention.

Referring to FIG. 2, a circuit for setting a threshold voltage for a reference memory cell in accordance with a preferred embodiment of the present invention includes a reference memory cell 31 having a source, a drain, a floating gate and a control gate, a first power source VD 32 for supplying a program current to the reference memory cell 31 when the reference memory cell 31 is programmed, a second power source VC 33 for supplying voltage to the control gate of the reference memory cell 31 when the reference memory cell 31 is programmed or a current to the reference memory cell 31 is read, a third current VS 34 connected to the source of the reference memory cell 31, a switch S 37 having one end connected to a drain of the reference memory cell 31 for controlling a path for external measuring of a current flowing to the reference memory cell 31 in response to a measuring signal, an external pad 36 connected to the other end of the switch 37 for direct external measuring of a current to the reference memory cell 31, and a current detector 35 connected between the first power source 32 and a drain of the reference memory cell 31 for receiving a program signal which is a control signal and starting programming of the reference memory cell 31, and forcibly stopping the programming of the reference memory cell 31 by generating a stop signal when a current of the reference memory cell $I_{CELL}$ is the same with a reference current $I_{STOP}$ while the current to the reference memory cell 31 is monitored. The second power source VC applies the same voltage when the reference memory cell is either programmed or read. The switch 37 is connected between the drain of the reference memory cell 31 and the external pad 36 for controlling connection between the drain of the reference memory cell 31 and the external pad 36 in response to a measure signal. This path is used for measuring the current to the reference memory cell 31 when the reference memory cell 31 is in operation. When the current to the reference memory cell 31 is measured, the control gate of the reference memory cell 31 has a $VC_{C.OPR}$ applied thereto, and the drain thereof has a voltage applied thereto, which is lower than the voltage used when the reference memory cell 31 is initialized. Alike the control gate, if the drain has the voltage used when the reference memory cell 31 is initialized applied thereto as it is, the program operation is started no later than the reference memory cell 31 is put into operation, to ruin the threshold voltage of the reference memory cell 31 which is fixed with effort. Accordingly, when the reference memory cell 31 is put into operation actually after the reference memory cell 31 is initialized, approx. 1V is applied to the drain, the current to the reference memory cell 31 is measured through the external pad 36 while a voltage identical to the drain is applied from the external pad 36. In this instance, the current detector 35 is disabled using the program signal for excluding an influence from the VD voltage when the current to the reference memory cell 31 is measured externally, and leading the measuring current $I_{MEASURE}$ from the external pad 36 to flow only to the reference memory cell 31. The $V_{C.OPR}$ is a gate voltage of the reference memory cell 31 used when the reference memory cell 31 is programmed or read, and identical to the operation voltage used actually after the reference memory cell 31 is initialized. The current detector 35 connected to the drain of the reference memory cell 31 controls program under the control of the program signal of the reference memory cell 31.

Upon reception of a program signal PROGRAM of logic "0", the current detector 35 is disabled, to cut the drain of the reference memory cell 31 from the first power source VD. This operation is used when the current to the reference memory cell 31 is measured or the reference memory cell 31 is erased externally. And, upon reception of a program signal PROGRAM of logic "1", the first power source 31 VD is provided to the drain of the reference memory cell 31, to start programming of the reference memory cell 31. The current to the reference memory cell 31 is monitored on the same time with the program starting, until a moment the current to the reference memory cell 31 is equal to a preset reference stop current $I_{STOP}$ when a signal STOP is provided. According to this, operation of the first and second power source 32 and 33 which apply voltages to the drain and the control gate of the reference memory cell 31 are cut off, to stop the program, forcibly. Different from the related art in which an approach to the target threshold voltage is made by quantizing a charge amount injected at each time (not continuous in view of time) using the program pulse and repeating the injection, since the charge injection is continuous in view of time in the present invention, the present invention basically has no problem of the related art which has a limitation of resolution caused by the pulse width (charge amount injected in one time).

The present invention suggests use of auto-verify for setting a threshold voltage of a reference memory cell to a target value accurately only by two times of program, of which concept will be explained with reference to the attached drawings.

Figure 3:
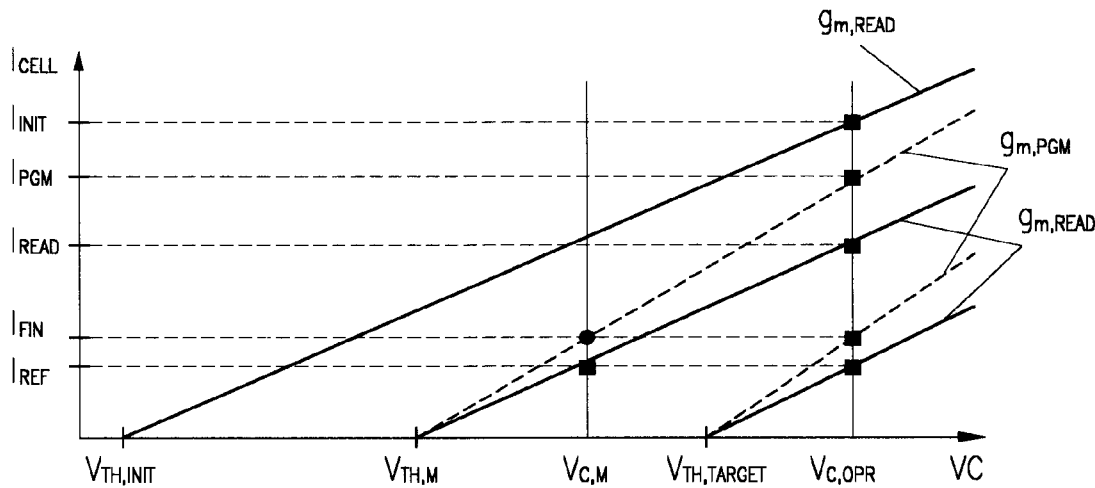
FIG. 3 illustrates a concept for setting a threshold voltage for a reference memory cell in FIG. 2; and, FIG. 4 illustrates a flow chart showing a method for setting a threshold voltage for a reference memory cell in accordance with a preferred embodiment of the present invention.

Referring to FIG. 3, because program is forcibly stopped at a moment the current $I_{CELL}$ flowing to the reference memory cell 31 is equal to the preset reference stop current $I_{STOP}$ during programming by the current detector 35, if the $I_{STOP}$ is set to be identical to the desired target current $I_{REF}$ before programming, it seems that the threshold voltage of the reference cell can be set to the target value accurately by one time of program, because the current to the reference memory cell 31 is identical to the target value $I_{REF}$. This is true if a condition(voltages applied to the control gate and the drain) when the reference memory cell 31 is put into operation and a program operation condition for initializing the reference memory cell 31 are identical. However, as has been explained, the control gate voltage of the reference memory cell 31 may be the same both in programming and reading, the drain voltage of the same in reading should be substantially lower than in programming. If not so, i.e., if the voltages are the same, upon application of power for reading the current of the reference memory cell 31, the reference memory cell 31 makes a programming operation right away, that makes the initialization meaningless. Thus, a difference between programming and reading of the reference memory cell 31 comes from a difference of voltages applied to the reference memory cell 31 in programming and reading.(the voltage in programming is as high as 4~6V and the voltage in reading is as low as 1V). If a drain conductance $g_{ds}$ of the reference memory cell 31 is "0" ideally(an output resistance of the reference memory cell 31 is α), with no current variation of the reference memory cell 31 caused by the drain voltage in a saturation region, it is possible that the reference memory cell reaches to the target current by one time of programming. However, because the drain voltages in programming and reading are different even if the control gate voltages in programming and reading are the same, the currents to the reference memory cell 31 in programming and reading are different as there is no such ideal reference memory cell 31 with $g_{ds}=0$, actually. And, the current in programming is greater than the current in reading as the $g_{ds}$ has a positive value. Therefore, when $I_{REF}$ is applied to $I_{STOP}$, programming is done, and the current is read under a read condition, the read current is always lower than the target current. Since a great reference stop current $I_{STOP}$ leads the programming to terminate at a great reference memory cell current, a time period required for the programming is shortened, that causes an amount of current injected into the floating gate of the reference memory cell 31 small, resulting to program the threshold voltage lower. Opposite to this, since a small reference stop current $I_{STOP}$ leads the programming to terminate at a small reference memory cell current, a time period required for the programming is prolonged, that causes an amount of current injected into the floating gate of the reference memory cell 31 great, resulting to program the threshold voltage higher. And, a low threshold voltage of the reference memory cell 31 leads the current to the reference memory cell 31 great when reading under the same condition, and, opposite to this, a high threshold voltage of the reference memory cell 31 leads the current to the reference memory cell 31 small. The present invention suggests calculation of a value for compensating a difference caused by $g_{ds}$, by a first programming and using a result of the calculation in a second programming for setting the threshold voltage of the reference memory cell to the target value accurately by only two times of programming.

The X-axis in FIG. 3 represents VC, a voltage applied to the control gate of the reference memory cell 31, and the Y-axis represents a current $I_{CELL}$ to the reference memory cell 31. $V_{C.OPR}$ in FIG. 3 denotes a voltage applied to the control gate of the reference memory cell 31 when the reference memory cell 31 is programmed or read, $V_{TH.TARGET}$ denotes a target threshold voltage, and $V_{TH.INIT}$ denotes an initial threshold voltage of the reference memory cell 31. And, $V_{TH.M}$ denotes a threshold voltage of the reference memory cell 31 when the reference memory cell 31 is programmed setting $I_{PGM}$ as a programming termination reference, and $V_{C.M}$ denotes a control gate voltage which leads a current by the threshold voltage of the first programming to be the same as the target current $I_{REF}$. And, $I_{INIT}$ on Y-axis denotes an initial current to the reference memory cell 31, $I_{PGM}$ denotes a reference current for terminating the first programming of the reference memory cell 31, $I_{READ}$ denotes a current measured after the first programming, $I_{FIN}$ denotes a reference current for terminating the second programming of the reference memory cell 31, and $I_{REF}$ is a target current equal to the target threshold voltage of the reference memory cell 31.

Figure 4:
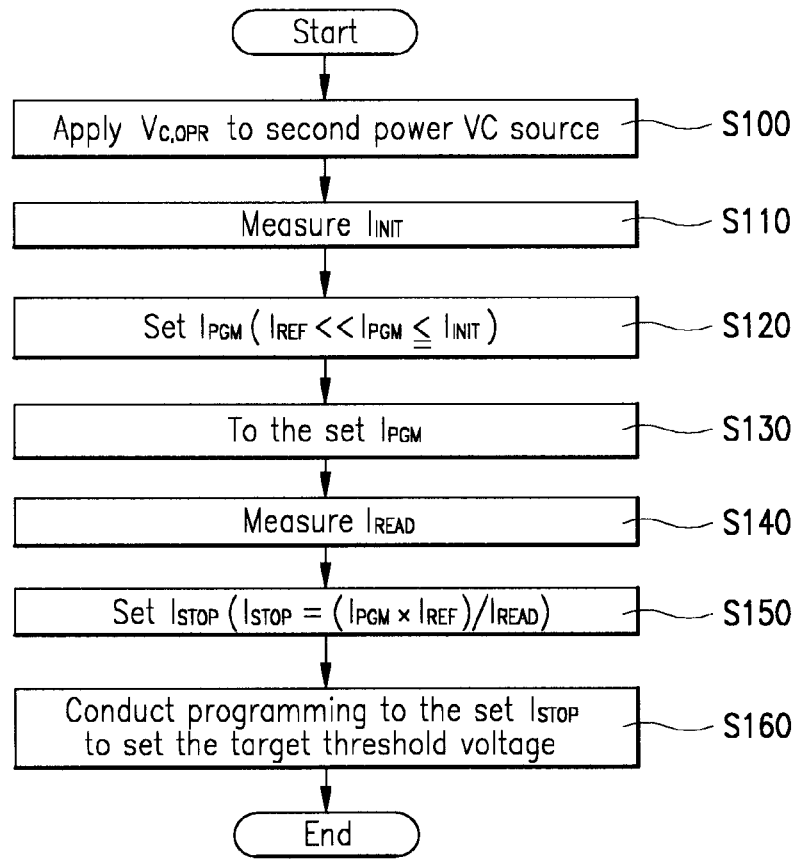

A method for setting a threshold voltage for the reference memory cell of the present invention will be explained with reference to FIGS. 2, 3 and 4.

$V_{C.OPR}$ is applied to the second power source VC(S100), a measuring signal Measure is enabled, and a current to the reference memory cell 31 is measured. In this instance, a drain voltage to the reference memory cell 31 supplied from an external pad PAD 36 should be set to be operative at a read condition of the reference memory cell 31. According to this, as shown in FIG. 3, $I_{INIT}$, a point at which $gm._{READ}$ a read mode gm at $V_{TH.INIT}$ and $V_{C.OPR}$ are met is measured (S110). Then, $I_{PGM}$, a reference current $I_{STOP}$ for stopping the first programming, is set equal to or slightly smaller than the $I_{INIT}$(S120). In this instance, care should be taken not to set the $I_{PGM}$ too small, that causes the threshold voltage of the reference memory cell 31 higher than the target value. That is, as shown in FIG. 3, $I_{PGM}$ is set such that the threshold voltage after the first programming is to be around $V_{TH.M}$ which is in the middle of the $V_{TH.INIT}$ and the $V_{TH.TARGET}$. In this instance, $I_{PGM}$ may be set equal to $I_{INIT}$, theoretically. Thereafter, the cell is programmed by auto-verify taking the set $I_{PGM}$ as $I_{STOP}$(S130). As shown in FIG. 3, provided the programming is proceeded according the foregoing process, the programming will be stopped at a point $V_{C.OPR}$ and $I_{PGM}$ are met. And, a threshold voltage $V_{TH.M}$ after the programming can be obtained if an intersection of a line of gm of a program mode crossing the point $V_{C.OPR}$ and $I_{PGM}$ are met. $V_{C.OPR}$ and $I_{PGM}$ with X-axis is obtained. And, if the current to the reference memory cell 31 is measured, while the $V_{C.OPR}$, the control voltage to the reference memory cell 31, is fixed and a mode is changed over to a measure mode, a point at which a read mode gm curve started from $V_{TH.M}$ meets with $V_{C.OPR}$, i.e., $I_{READ}$ is measured.(S140). Alike the target current $I_{REF}$ can be obtained at an intersection of the read mode gm curve started from the target threshold voltage with $V_{C.OPR}$, $I_{FIN}$ can be obtained at an intersection of the program mode gm curve started from the target threshold voltage with $V_{C.OPR}$. Upon programing in the auto-verifying method with the $I_{FIN}$ set as $I_{STOP}$, the programming will terminate at an intersection of the $V_{C.OPR}$ and the $I_{FIN}$. It can be known that an intersection of a program mode gm curve started from the intersection of the $V_{C.OPR}$ and the $I_{FIN}$ and X-axis are the $V_{TH.TARGET}$. Thus, $I_{PGM}$, $I_{READ}$, $I_{REF}$ and $V_{C.OPR}$ are used in calculating and setting $I_{FIN}$, which is $I_{STOP}$.(S150). Thus, upon setting $I_{FIN}$, which is $I_{STOP}$, the target threshold voltage can be set by one time of programming using the set $I_{STOP}$.(S160).

The $I_{FIN}$ can be calculated according to the following equation. The gm, a transconductance, is a current change of a reference memory cell 31 according to a voltage change of a control gate, i.e., as shown in FIG. 3, a value obtained by dividing an Y-axis change by an X-axis change. Therefore, a gm in a program mode and a read mode for $V_{TH.M}$ and $V_{C.OPR}$ can be obtained by equations (1) and (2) shown below, respectively.

$$g_{m,PGM} = \frac{I_{PGM}}{V_{C.OPR} - V_{TH.M}} \quad (1)$$

$$g_{m,READ} = \frac{I_{READ}}{V_{C.OPR} - V_{TH.M}} \quad (2)$$

gm for changes of $V_{C.M}$ and $V_{C.OPR}$ can be expressed as equations (3) and (4).

$$g_{m,PGM} = \frac{I_{PGM} - I_{FIN}}{V_{C.OPR} - V_{C.M}} \quad (3)$$

$$g_{m,READ} = \frac{I_{READ} - I_{REF}}{V_{C.OPR} - V_{C.M}} \quad (4)$$

The following equations (5) and (6) are obtained from equations (3) and (4).

$$\frac{I_{PGM}}{V_{C.OPR} - V_{TH.M}} = \frac{I_{PGM} - I_{FIN}}{V_{C.OPR} - V_{C.M}} \quad (5)$$

$$\frac{I_{READ}}{V_{C.OPR} - V_{TH.M}} = \frac{I_{READ} - I_{REF}}{V_{C.OPR} - V_{C.M}} \quad (6)$$

When equation (6) is expressed with respect to $V_{C.OPR} - V_{TH.M}$, which is replaced with the same in equation (5), the following equation can be obtained.

$$\frac{I_{PGM}(I_{READ} - I_{REF})}{I_{READ}(V_{C.OPR} - V_{C.M})} = \frac{I_{PGM} - I_{FIN}}{V_{C.OPR} - V_{C.M}}, \quad (7)$$

which is then summarized as follows.

$$I_{FIN} = \frac{I_{PGM} - I_{REF}}{I_{READ}}$$

Eventually, a final target current $I_{FIN}$ can be obtained with easy by using $I_{PGM}$ which an initial program stop reference current, $I_{REF}$ which is the target current, and $I_{READ}$ which is a current measured in a read mode after the first program stop. When the programming is conducted in the aforementioned auto-verifying method by using the calculated current taken as $I_{STOP}$, the threshold voltage of the reference memory cell 31 can be set at a desired position, accurately. (S160) Next, in order to apply the aforementioned method for two or more than two memory cells, a Y-selector(switch transistor) is inserted into the drain of each reference memory cell for permitting selection of any one reference memory cell. And, when two or more than two reference memory cells are initialized, an $I_{FIN}$ may be calculated by using the reference memory cell selected at the first time, which may then be used in common in initializing all the rest of reference memory cells. In this instance, since only one time of the $I_{FIN}$ calculation is required for the reference memory cell selected for the first time, a number of programming required for entire reference memory cells will be a total number of cells to be initialized+1. In this instance, there may be an error occurred by a difference of gm for each reference memory cell. Alternatively, when two or more than two reference memory cells are initialized, $I_{FIN}$ may be calculated for all the reference memory cells respectively to use in initializing respective reference memory cells. A number of programming required for the initialization is a total number of the reference memory cells to be initialized× 2. In this instance, all the reference memory cells can be initialized, accurately.

As has been explained, the threshold voltage setting circuit for a reference memory cell of the present invention, and the method for setting a threshold voltage using the same have the following advantages. A threshold voltage of one reference memory cell can be set to a desired level from a condition the reference memory cell is operative actually by two times of programming, accurately and quickly.

It will be apparent to those skilled in the art that various modifications and variations can be made in the threshold voltage setting circuit for a reference memory cell of the present invention, and the method for setting a threshold voltage using the same of the present invention without departing from the spirit or scope of the invention. Thus, it is intended that the present invention cover the modifications and variations of this invention provided they come within the scope of the appended claims and their equivalents.

What is claimed is:

1. A threshold voltage setting circuit for a reference memory cell comprising:

a reference memory cell having a source, a drain, a floating gate and a control gate;

a first power source for applying a voltage to the drain of the reference memory cell under the control of the current detector when the reference memory cell is programmed;

a second power source for supplying a voltage to the control gate of the reference memory cell when the reference memory cell is programmed or read;

a third current connected to the source of the reference memory cell;

a switch connected to the drain of the reference memory cell for controlling a path for external measuring of a current flowing to the reference memory cell in response to a measuring signal; and, a current detector connected between the first power source and the drain of the reference memory cell for providing a stop signal to the first and second power sources to stop the programming of the reference memory cell forcibly when a current to the reference memory cell, which is monitored during the programming of the reference memory cell in response to a program signal, is the same with a reference stop current.

2. A threshold voltage setting circuit for a reference memory cell comprising:

a plurality of reference memory cells each having a source, a drain, a floating gate and a control gate;

a first power source for applying a voltage to the drain of the reference memory cell through the current detector when the reference memory cell is programmed;

a second power source for supplying a voltage to the control gate of the reference memory cell when the reference memory cell is programmed or read;

a third current connected to the source of the reference memory cell;

a selection transistor having one terminal connected to the drain of each of the reference memory cells and the other terminal connected to one bitline, for selecting one of the reference memory cells;

a switch connected to the selection transistor for controlling a path for external measuring of a current flowing to the selected reference memory cell in response to a measuring signal; and, a current detector connected between the first power source and the selection transistor for receiving a program signal in starting programming of the selected reference memory cell, monitoring a current to the reference memory cell, and providing a stop signal to the first and second power sources to stop the programming of the reference memory cell forcibly when the current to the reference memory cell is the same with a reference stop current.

3. A method for setting a threshold voltage by using a circuit for setting a threshold voltage for a reference memory cell, comprising the steps of:

(1) applying a voltage to the control gate for programming a selected unit reference memory cell in a reference memory cell unit;

(2) closing a switch for measuring an initial current to the unit reference memory cell;

(3) setting a first program stop reference current equal to, or slightly smaller than the initial current;

(4) programming the selected unit reference memory cell by using the first program stop reference current according to an auto-verifying method;

(5) fixing the voltage applied to the control gate of the selected unit reference memory cell and changing over to a read mode for measuring a current to the selected unit reference memory cell after the selected unit reference memory cell is programmed;

(6) setting a target current by using a transconductance in a read mode at a target threshold voltage;

(7) calculating a final program stop reference current by using a first program stop reference current, a target current, and a current measured in a read mode;

(8) programming the selected unit reference memory cell by auto verifying method to set a target threshold voltage by using the final program stop reference current.

4. A method as claimed in claim 3, wherein the first program stop reference current is set after a threshold voltage after the first programming is set to have a value between an initial threshold voltage and a target threshold voltage.

5. A method as claimed in claim 3, wherein the final program stop reference current is obtained by dividing a value obtained by multiplying the first program stop reference current and the target current by a current measured in a read mode condition.

6. A method as claimed in claim 3, wherein the current to the selected unit reference memory cell after the programming is measured by an external pad by closing the switch connected to the drain of the selected unit reference memory cell.

7. A method as claimed in claim 3, wherein, if the reference memory cell unit includes a plurality of reference memory cells, the reference memory cells are selected one by one by using a selection transistor connected to the drain of each reference memory cell for setting a target threshold voltage of respective reference memory cells.

8. A method as claimed in claim 3, if the reference memory cell unit includes a plurality of reference memory cells, the method comprising the steps of:

selecting one reference memory cell by using a selection transistor, obtaining a final target current value of the selected one reference memory cell and setting the target threshold voltage, and setting target threshold voltages of the rest reference memory cells by one time of programming by using the final target current value obtained from the selected reference memory cell.

* * * * *